United States Patent
Kim et al.

(10) Patent No.: US 9,418,838 B2
(45) Date of Patent: Aug. 16, 2016

(54) ELECTRONIC DEVICE AND METHOD FOR FABRICATING THE SAME

(71) Applicant: SK hynix Inc., Icheon-Si (KR)

(72) Inventors: Sook-Joo Kim, Icheon-si (KR);
Jae-Geun Oh, Icheon-Si (KR);
Hyung-Suk Lee, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/792,466

(22) Filed: Jul. 6, 2015

(65) Prior Publication Data
US 2016/0181522 A1    Jun. 23, 2016

(30) Foreign Application Priority Data

Dec. 17, 2014   (KR) .................. 10-2014-0182704

(51) Int. Cl.
*H01L 21/02*     (2006.01)
*H01L 45/00*     (2006.01)

(52) U.S. Cl.
CPC ...... *H01L 21/02356* (2013.01); *H01L 45/1233* (2013.01); *H01L 45/1253* (2013.01); *H01L 45/145* (2013.01); *H01L 45/1641* (2013.01)

(58) Field of Classification Search
CPC ................ H01L 45/1233; H01L 45/06; H01L 21/02356
See application file for complete search history.

(56) References Cited

U.S. PATENT DOCUMENTS

| | | | |
|---|---|---|---|
| 6,287,944 B1 * | 9/2001 | Hara | H01L 21/2026 257/E21.134 |
| 7,795,124 B2 | 9/2010 | Nouri et al. | |
| 8,101,480 B1 * | 1/2012 | Kim | H01L 21/823807 257/190 |
| 2002/0066913 A1 * | 6/2002 | Tseng | H01L 29/66606 257/288 |
| 2008/0284935 A1 * | 11/2008 | Takahashi | G02F 1/136286 349/46 |
| 2011/0003459 A1 * | 1/2011 | Shin | H01L 27/105 438/430 |
| 2012/0156869 A1 * | 6/2012 | Shin | H01L 23/485 438/589 |
| 2014/0117349 A1 * | 5/2014 | Wenxu | H01L 21/02595 257/43 |
| 2014/0254239 A1 * | 9/2014 | Song | H01L 27/2436 365/148 |
| 2015/0093872 A1 * | 4/2015 | Chan | H01L 29/66242 438/312 |

FOREIGN PATENT DOCUMENTS

| KR | 10-2006-0114408 A | 6/2006 |
|---|---|---|
| KR | 10-2013-0103061 A | 9/2013 |

* cited by examiner

*Primary Examiner* — Joseph C Nicely
(74) *Attorney, Agent, or Firm* — Perkins Coie LLP

(57) ABSTRACT

An electronic device with improved variable resistance characteristics and a method for fabricating the same are provided. In an embodiment of the disclosed technology, a method for forming an electronic device with a semiconductor memory includes forming a crystalized doped layer over a substrate; forming a barrier layer over the doped layer; forming a metal layer over the barrier layer; and reacting the barrier layer with a portion of the metal layer. The electronic device and the method of fabricating the same according to embodiments of the disclosed technology may have improved variable resistance characteristics.

17 Claims, 10 Drawing Sheets

ION IMPLANTATION

LASER ANNEALING

CHANGE INTO AMORPHOUS LAYER

ELECTRONIC DEVICE AND METHOD FOR FABRICATING THE SAME

CROSS-REFERENCE TO RELATED APPLICATIONS

The present application claims priority and benefits of Korean Patent Application No. 10-2014-0182704, entitled "ELECTRONIC DEVICE AND METHOD FOR FABRICATING THE SAME" and filed on Dec. 17, 2014, which is incorporated herein by reference in its entirety.

TECHNICAL FIELD

This patent document relates to a memory circuit or a memory device and an electronic device employing the same.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document provides an electronic device with improved variable resistance characteristics and a method for fabricating the same.

The disclosed technology in this patent document includes memory circuits or devices and their applications in electronic devices or systems and various implementations of an electronic device in which an electronic device capable of improving the characteristics of a variable resistance element is provided.

In an aspect, a method for forming an electronic device with a semiconductor memory is provided to include forming a crystalized doped layer over a substrate; forming a barrier layer over the crystalized doped layer; forming a metal layer over the barrier layer; and reacting the barrier layer with a portion of the metal layer.

Implementations of the above method for forming an electronic device with a semiconductor memory may include one or more the following.

The forming of the crystalized doped layer includes: doping impurities into the substrate to form a doped region in the substrate; and performing laser annealing to recrystallize the doped region to form the crystalized doped layer. The forming of the barrier layer includes transforming the material structure of a portion of the crystalized doped layer into an amorphous layer. The forming of the barrier layer includes performing ion implantation into the crystalized doped layer. The barrier layer has a depth smaller than the depth of the doped region. The metal layer includes a single layer or a multi-layer. The metal layer includes a stack including a titanium layer and a titanium nitride layer. The reacting of the barrier layer and the portion of the metal layer includes performing heat treatment on the barrier layer and the portion of the metal layer. The reacting of the barrier layer with the portion of the metal layer including forming a silicide layer.

In another aspect, a method for forming an electronic device with a semiconductor memory is provided to includes forming buried gates in a substrate; forming a recess in the substrate between neighboring buried gates; forming a crystalized doped layer to fill in a lower portion of the recess; forming a landing plug in the recess over the crystalized doped layer, wherein the landing plug includes a stack of a silicide layer and a metal layer; forming an interlayer insulating layer over the substrate including the landing plug; forming a lower electrode contact that passes through the interlayer insulating layer and is in contact with the landing plug; and forming a variable resistance element which is disposed over the interlayer insulating layer and is coupled to the lower electrode contact.

Implementations of the above method for forming an electronic device with a semiconductor memory may include one or more the following.

The forming of the crystalized doped layer includes: doping impurities into the substrate under the recess to form a doped region; and performing laser annealing to recrystallize the doped region to form the crystalized doped layer. The forming of the landing plug includes: changing the material structure of the crystalized doped layer to form a barrier layer over the crystalized doped layer; forming the metal layer over the barrier layer to fill the recess; and reacting the barrier layer and a portion of the metal layer. The changing of the material structure of the crystalized doped layer includes transforming a portion of the crystalized doped layer into an amorphous layer. The changing of the material structure of the crystalized doped layer includes performing ion implantation into the crystalized doped layer. The metal layer includes a single layer or a multi-layer. The metal layer includes a stack including a titanium layer and a titanium nitride layer. The reacting of the barrier layer and the portion of the metal layer includes performing heat treatment on the barrier layer and the portion of the metal layer.

In another aspect$_{[NN1]}$, an electronic device is provided to include a semiconductor memory that includes buried gates formed in a substrate; a recess disposed in the substrate between neighboring buried gates; a crystalized doped layer formed in the substrate to fill in a lower portion of the recess; a landing plug formed in the recess over the crystalized doped layer and including a stack that includes a silicide layer and a metal layer; an interlayer insulating layer formed over the substrate including the landing plug; a lower electrode contact passing through the interlayer insulating layer and being in contact with the landing plug; and a variable resistance element formed over the interlayer insulating layer and being in contact with the lower electrode contact.

Implementations of the above electronic device may include one or more the following.

The silicide layer includes a titanium silicide layer. The metal layer includes a titanium nitride layer. The variable resistance element includes transitional metal oxide, metal oxide including perovskite material, phase-changing material including chalcogenide material, ferroelectric material, or ferromagnetic material, or a stack thereof. The semiconductor memory further comprising: a conductive line formed over the variable resistance element; and an upper electrode contact coupling the conductive line to the variable resistance element. The crystalized doped layer includes impurities of sufficient dose to reduce the interface resistance between the substrate and the silicide layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

The electronic device and the method of fabricating the same according to various implementations of the disclosed technology can be used to achieve certain advantages or benefits, including improving the performance or characteristics of a variable resistance element.

DETAILED DESCRIPTION

Figure 1A:
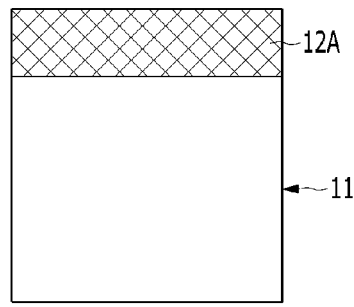
FIGS. 1A through 1E are cross-sectional views showing an example of a method for fabricating an electronic device according to one implementation of the disclosed technology.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIGS. 1A to 1E are cross-sectional views showing an example of a method for fabricating an electronic device according to one implementation of the disclosed technology.

As shown in FIG. 1A, a doped layer 12A may be formed by doping impurities into a substrate 11. The doped region 12A may reduce interface resistance between a substrate and a silicide layer which will be formed in a subsequent process.

The doped region 12A may be formed by doping impurities into the substrate 11 to a certain depth. When high concentration of impurities is implanted into the substrate 11 to a given depth, the doped region 12A may have an amorphous structure.

When the amorphous structure of the doped region 12A is subject to a subsequent process, defects may occur and a non-uniform silicide layer may be formed in the subsequent process. In some implementations of the disclosed technology, to prevent the non-uniform silicide layer, laser annealing may be performed to recrystallize the entire doped region 12A.

Figure 1B:
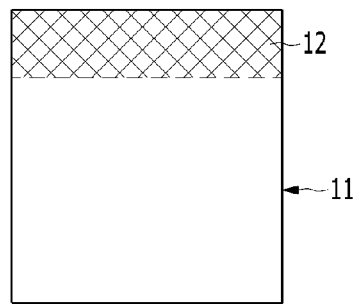

As shown in FIG. 1B, in some implementations, the entire doped region 12A (see FIG. 1a) may be recrystallized by laser annealing. The laser annealing is performed until the entire amorphous doped region is recrystallized. For example, the laser annealing may be performed at 110 degrees Celsius or more. As a result, a doped layer 12 with a given depth may be formed in the substrate 11.

The doped layer 12 includes impurities of sufficient dose to reduce the interface resistance between a substrate and the silicide layer which will be formed in a subsequent process. Since the amorphous doped region becomes recrystallized by the laser annealing, defects due to the existence of the amorphous doped layer 12 can be prevented.

Figure 1C:
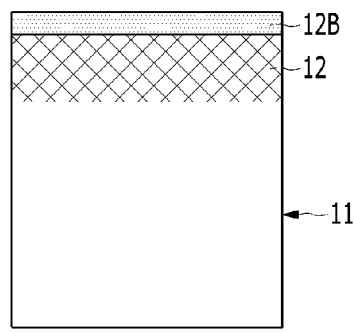

As shown in FIG. 1C, a portion of the doped layer 12, e.g., an upper surface of the substrate 11 with a given depth is transformed into an amorphous state. The depth of the amorphous region 12B may be shallower or smaller than the depth of the doped layer 12. The amorphous region 12B may extend down to a depth same as or deeper or greater than the depth of the silicide layer which will be formed in a subsequent process.

The amorphous region 12B may be formed by ion implantation. The ion implantation for forming the amorphous region 12B may be performed to a depth smaller than the depth of the doped layer 12. The ion implantation for forming the amorphous region 12B may be performed using light atoms such as P. The target depth of the ion implantation may be set to around 50 angstroms to around 100 angstroms.

The amorphous region 12B may react with a metal layer to form a silicide layer in a subsequent process and serve as a barrier defining the silicide layer. Hereinafter, the amorphous region 12B is referred to as a barrier layer 12B.

Figure 1D:
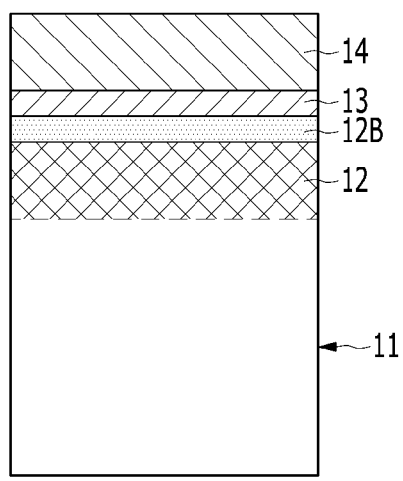
Figure 1E:
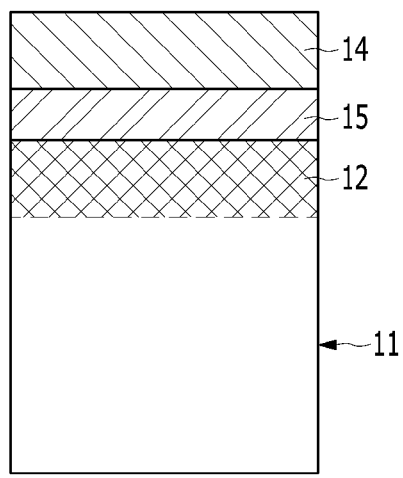

As shown in FIG. 1D, a metal layer 13 and 14 may be formed over the barrier layer 12B. The metal layer 13 and 14 may be formed of or include a single layer or a multi-layer. The metal layer 13 and 14 may include a stack of a metal layer 13 and a metal nitride layer 14. For example, the metal layer 13 and 14 may include a stack of a metal layer and a metal nitride layer. As shown in FIG. 1E, the barrier layer 12B (see FIG. 1D) may react with the metal layer 13 (see FIG. 1D). The barrier layer and the metal layer react to form a silicide layer 15. The silicide layer 15 may include, for example, a titanium silicide layer. To form the silicide layer, the barrier layer and the metal layer may react by a heat treatment. The heat treatment may include Rapid Thermal Anneal (RTA).

Figure 2:
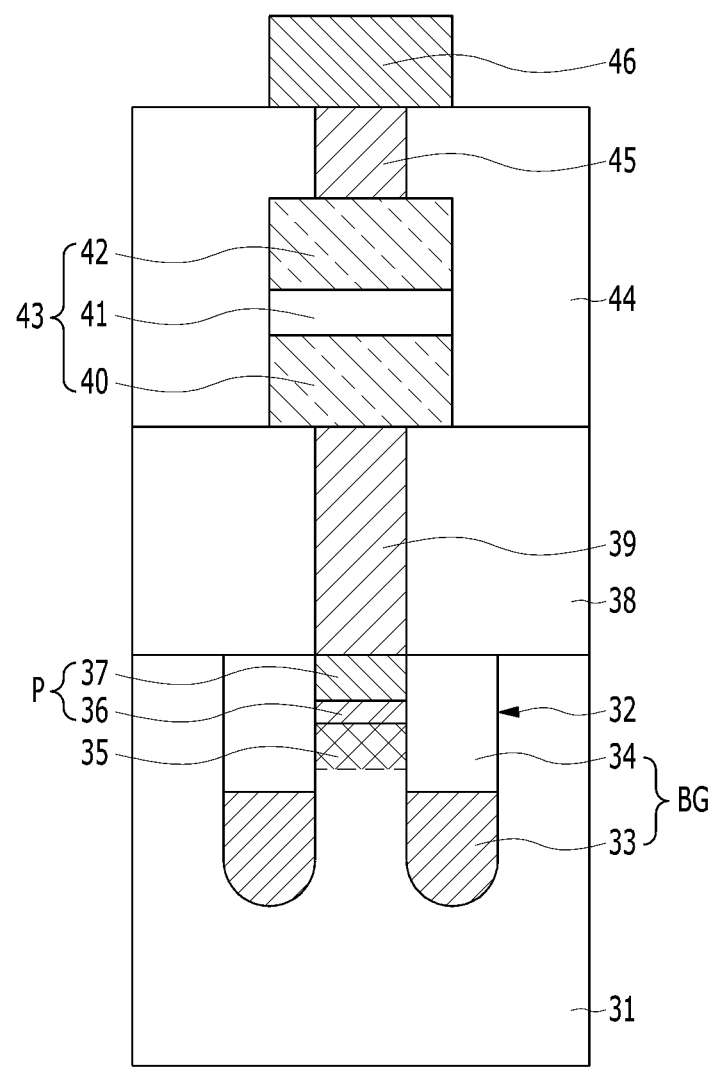
FIG. 2 is cross-sectional view showing an exemplary electronic device according to one implementation of the disclosed technology.

FIG. 2 is a cross-sectional view showing an exemplary electronic device according to one implementation of the disclosed technology. As shown in FIG. 2, an electronic device according to an embodiment of the disclosed technology may include a substrate 31, a switching element BG formed in the substrate 31 and including a gate electrode 33 and a sealing layer 34, a doped layer 35 formed in the substrate between neighboring switching elements BG, a landing plug P formed over the doped layer 35 and including the silicide layer 36 and the metal layer 37, a first interlayer insulating layer 38 formed over the substrate 31 including the landing plug P, a lower electrode contact 39 passing through the first interlayer insulating layer 38 and being in contact with the landing plug P, a variable resistance element or device 43 formed over the first interlayer insulating layer 38 and being in contact with the lower electrode contact 39, a second interlayer insulating layer 44 covering the variable resistance elements 43, a conductive line 46 formed over the second interlayer insulating layer 44, and an upper electrode contact 45 passing through the second interlayer insulating layer 44 and electrically connecting the conductive line 46 and the variable resistance device 43.

The switching element BG selects a specific unit cell among a plurality of unit cells included in a semiconductor device and may include a transistor, or a diode, etc. A first terminal of the switching electrode may be electrically connected to the lower electrode contact 39, and a second terminal may be electrically connected to a source line through a source line contact (not shown).

According to some implementations of the disclosed technology, the landing plug P may be formed of or include a stack of the silicide layer 36 and the metal layer 37 that are disposed in the substrate 31 between the switching elements BG. In some implementation, the stack of the silicide layer 36 and the metal layer 37 are formed to the same thickness as the doped layer 35 having a sufficient dose.

Each of the first and the second interlayer insulating layers 38 and 44 may include insulating material. Each of the first and the second interlayer insulating layers 38 and 44 may include an oxide layer, a nitride layer, or an oxide nitride layer, or a multi-layer including two or more of the above.

The lower electrode contact 39 serves as a conduit through which current or voltage is supplied to the variable resistance element 43 and may include various conductive materials such as metal or metal nitride, etc.

The variable resistance element 43 may include material capable of switching between different resistance states depending on a change of voltage or current supplied to two terminals of the variable resistance element 43.

The variable resistance element 43 may include materials suitable for RRAM, PRAM, FRAM, or MRAM, etc. For example, the variable resistance element 43 may include a transitional metal oxide, metal oxide such as Perovskite material, or phase-changing material such as Chalcogenide material, ferroelectric material, or ferromagnetic material, etc. The variable resistance element 43 may have variable resistance characteristics and be formed of or include a single layer or a multi-layer.

For example, the variable resistance element 43 may have a Magnetic Tunnel Junction (MTJ) structure which includes a first magnetic layer 40, a second magnetic layer 42, and a tunnel barrier layer 41 formed between the first magnetic layer 40 and the second magnetic layer 42.

Each of the first magnetic layer 40 and the second magnetic layer 42 may include ferroelectric material such as Fe—Pt alloy, Fe—Pd alloy, Co—Pd alloy, Co—Pt alloy, Co—Fe alloy, Fe—Ni—Pt alloy, Co—Fe—Pt alloy, or Co—Ni—Pt alloy, or a multi-layer thereof.

One of the first magnetic layer 40 and the second magnetic layer 42 may have a changeable magnetic direction to serve as a free layer or a storage layer. The other of the first magnetic layer 40 and the second magnetic layer 42 may have a fixed magnetic direction to serve as a fixed layer or a reference layer. The tunnel barrier layer 41 allows electrons to tunnel through to change the magnetic direction of the free layer.

The tunnel barrier layer 41 may include oxide such as $Al_2O_3$, MgO, CaO, SrO, TiO, VO, or NbO and may be or include a single layer or a multi-layer thereof.

When the magnetic directions of the first and the second magnetic layers 40 and 42 are parallel to each other, the variable resistance element 43 may be at a low resistance state and store data, e.g., data, '0'.

When the magnetic directions of the first and the second magnetic layers 40 and 42 are anti-parallel to each other, the variable resistance element 43 may be at a high resistance state and store data, e.g., data, '1'. The variable resistance element 43 may include a MTJ structure and may further include various additional layers to improve the characteristics of the MTJ structure.

In other implementations, the variable resistance element 43 may include a metal oxide. The metal oxide includes oxygen vacancy and changes its resistance state depending on behavior of oxygen vacancy.

The upper electrode contact 45 electrically connects the conductive line 46 and the variable resistance device 43 and may serve as an electrode of the variable resistance device 43. The upper electrode contact 45 may be formed of or include the same material as the lower electrode contact 39.

The conductive line 46 may include a metal layer. The metal layer refers to a layer including metal element, e.g., a metal layer, a metal oxide layer, a metal nitride layer, a metal oxide nitride layer, or a metal silicide layer, etc.

FIGS. 3A to 3E are cross-sectional views showing an example of a method for fabricating the electronic device according to one implementation of the disclosed technology. In FIGS. 3A to 3E, the same or like features are denoted by the same reference numerals as in FIG. 2.

Figure 3A:
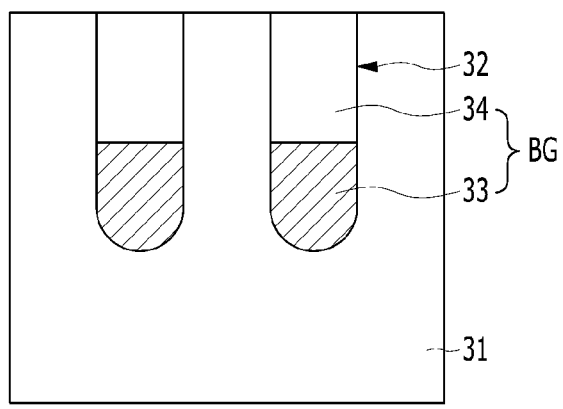
FIGS. 3A through 3E are cross-sectional views showing an example of a method for fabricating the electronic device according to one implementation of the disclosed technology.

As shown in FIG. 3A, the switching element BG may be formed in the substrate 31. The switching element BG may include a buried gate. The switching element BG may be formed in a trench 32 and may include a stack of a buried gate 33 and a sealing layer.

Figure 3B:
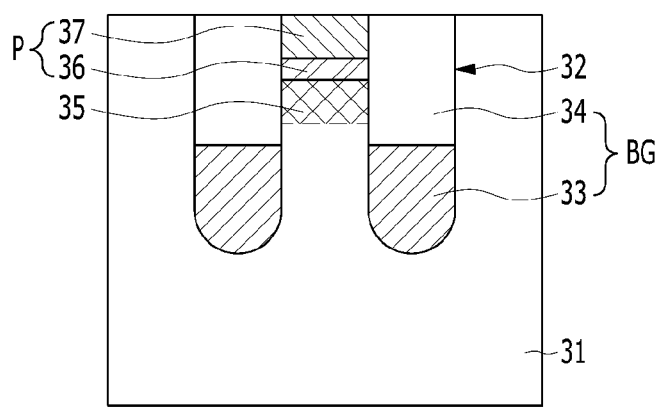

As shown in FIG. 3B, the doped layer 35 may be formed in the substrate between the switching devices BG. The landing plug P may be formed over the doped layer 35 and may include a stack of the silicide layer 36 and the metal layer 37.

The doped layer 35 and the landing plug P may be formed by the same method as shown in FIGS. 1A to 1F. For example, the doped layer 35 is formed with sufficient dose. The landing plug P includes the silicide layer 36, and the silicide layer 36 is formed to a uniform thickness.

Figure 3C:
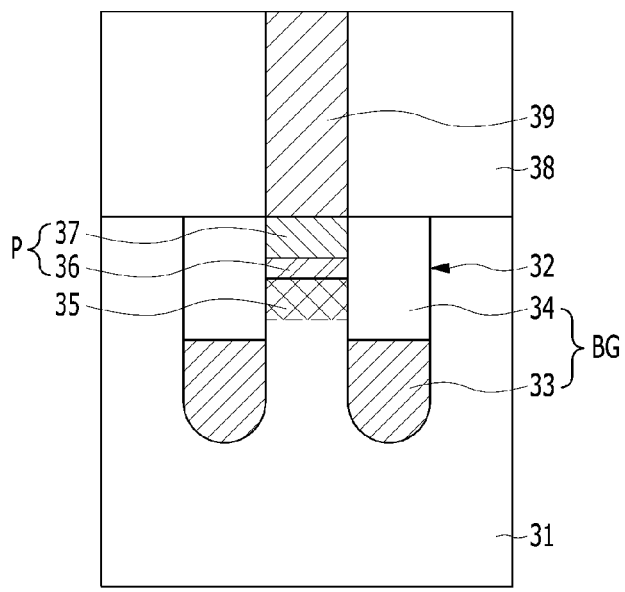

As shown in FIG. 3C, the first interlayer insulating layer 38 is formed over the substrate 31 including the landing plug P. The first interlayer insulating layer 38 may be formed of or include an oxide layer, a nitride layer, or an oxide nitride layer, or a stack thereof.

The lower electrode contact 39 may pass through the first interlayer insulating layer 38 and be in contact with the landing plug P. The lower electrode contact 39 may be formed as follows. A contact hole is formed to pass through the first interlayer insulating layer 38 and expose the landing plug P. The contact hole is filled with conductive material. Although a single lower electrode contact 39 is shown in FIG. 3C for the ease of illustration, two or more lower electrode contacts 39 may be formed in the first interlayer insulating layer 38. A separation process is performed to electrically insulate the lower electrode contact 39 from a neighboring lower electrode contact.

The separation process may be performed by etching or polishing the conductive material over the first interlayer insulating layer 38 using a blank etching process (e.g., etch back) or Chemical Mechanical Polishing (CMP) until the first interlayer insulating layer 38 is exposed.

Figure 3D:
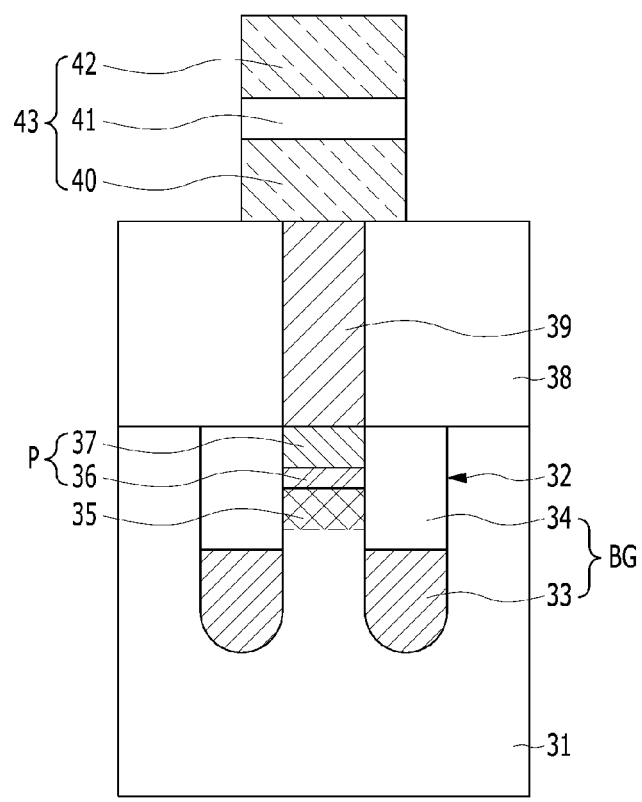

As shown in FIG. 3D, the variable resistance element 43 may be formed over the first interlayer insulating layer 30 and be in contact with the lower electrode contact 39. In FIG. 3D, the variable resistance device 43 has a width greater than the width of the lower electrode contact 39. However, in another embodiment, the width of the variable resistance element 43 may be smaller than the width of the lower electrode contact 39. The variable resistance element 43 may further include upper and lower electrodes (not shown).

The variable resistance element 43 may have switching property and thus may switch between different resistance states having different resistance values depending on a bias level (e.g., voltage or current) supplied to the variable resistance element 43 through the upper or/and lower electrode. Such switching property may allow the variable resistance element 43 to be utilized in various fields Including, for example, a data storage storing data.

The variable resistance element 43 may show variable resistance property depending on a change of bias supplied to the variable resistance element 43 through the upper electrode or/and the lower electrode. For example, the variable resistance element 43 may include phase-change material. The phase-change material may include Chalcogenide material.

The phase-change material may change its crystallinity from amorphous state to crystal state or vice versa depending on an external input (e.g., voltage or current) and switch between different resistance states.

The variable resistance element 43 may include metal oxide. The metal oxide may include Transition Metal Oxide (TMO), or Perovskite oxide, etc. The metal oxide may include oxygen vacancy. Vacancy behavior may either create or extinguish a conductive path depending on an external input level, showing switching property that resistance switches between different states.

The variable resistance element 43 may include a tunnel barrier layer 41 between the two magnetic layers 40 and 42. The structure including the two magnetic layers 40 and 42 and the tunnel barrier layer 41 may be referred to as Magnetic Tunnel Junction (MTJ).

When the magnetic directions of the two magnetic layers 40 and 42 are same (or in parallel to each other), the variable resistance element 43 is in a low resistance state. When the magnetic directions of the two magnetic layers 40 and 42 are different from each other (or in anti-parallel to each other), the variable resistance element 43 is in a high resistance state. However, the above definitions of the low resistance state and high resistance state are provided as examples and other implementations are also possible. Further, regarding the material of the variable resistance element 43, any material may serve as the variable resistance device 43 if it can switch between different resistance states depending on a change of bias supplied through the upper electrode or/and the lower electrode. A spacer (not shown) may be formed over a sidewall of the variable resistance device 43.

Figure 3E:
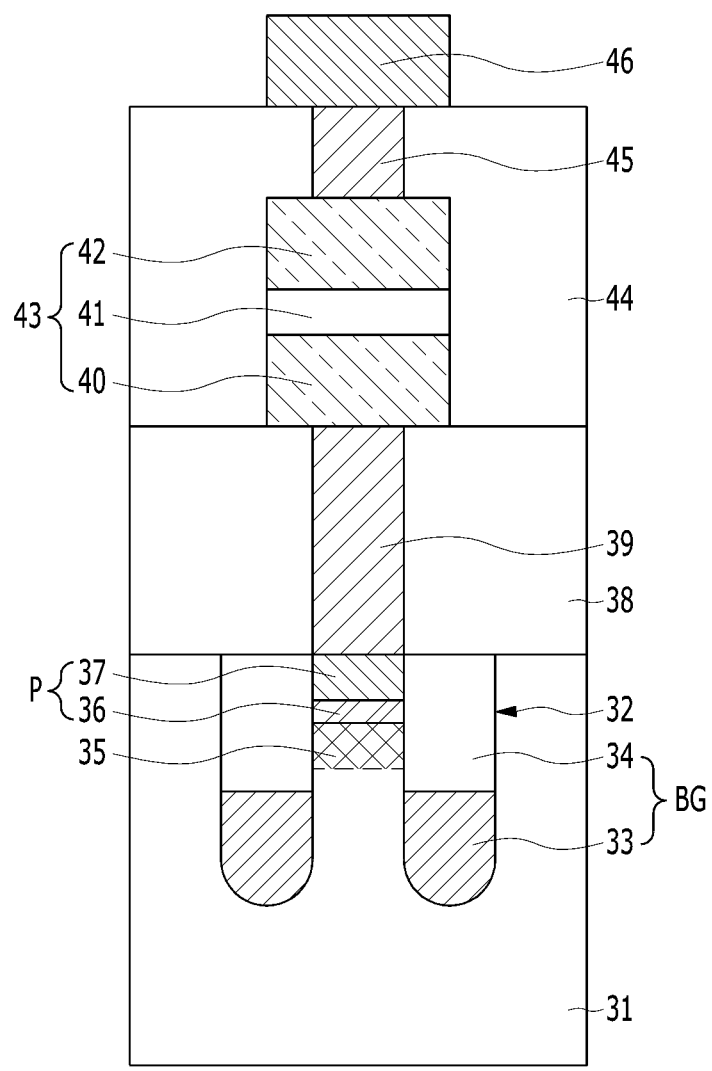

As shown in FIG. 3E, the second interlayer insulating layer 44 may be formed over the first interlayer insulating layer 38. The second interlayer insulating layer 44 may be formed to a thickness sufficient to fill between the variable resistance elements 43. For example, the second interlayer insulating layer 44 may be formed such that the upper surface of the second interlayer insulating layer 44 is arranged to be higher than an upper surface of the variable resistance device 44. The second interlayer insulating layer 44 may be formed of or include an oxide layer, a nitride layer, or an oxide nitride layer, or a stack thereof.

The upper electrode contact 45 is formed to pass through the second interlayer insulating layer 44 and being in contact with the variable resistance device 43. The upper electrode contact 45 may be formed as follows. A contact hole is formed to pass through the second interlayer insulating layer 44 and expose the upper surface of the variable resistance device 43. The contact hole is filled with conductive material.

The upper electrode contact 45 electrically connects the variable resistance device 43 and the first metal line 46, which will be formed in a subsequent process, and may serve as an electrode with respect to the variable resistance device 43. The upper electrode contact 45 may be formed of or include the same material as the lower electrode contact 39. Then, the conductive line 46 may be formed over the second interlayer insulating layer 44.

The conductive line 46 may be electrically connected to the variable resistance element 43 through the upper electrode contact 45. The conductive line 46 connected to the variable resistance element 43 may serve as a bit line. The conductive line 46 may include a metal layer. The metal layer indicates a layer including metal elements and may include a metal layer, a metal oxide layer, a metal nitride layer, a metal oxide nitride layer, or a metal silicide layer, etc.

The above and other memory circuits or semiconductor devices based on the disclosed technology can be used in a range of devices or systems. FIGS. 4-8 provide some examples of devices or systems that can implement the memory circuits disclosed herein.

Figure 4:
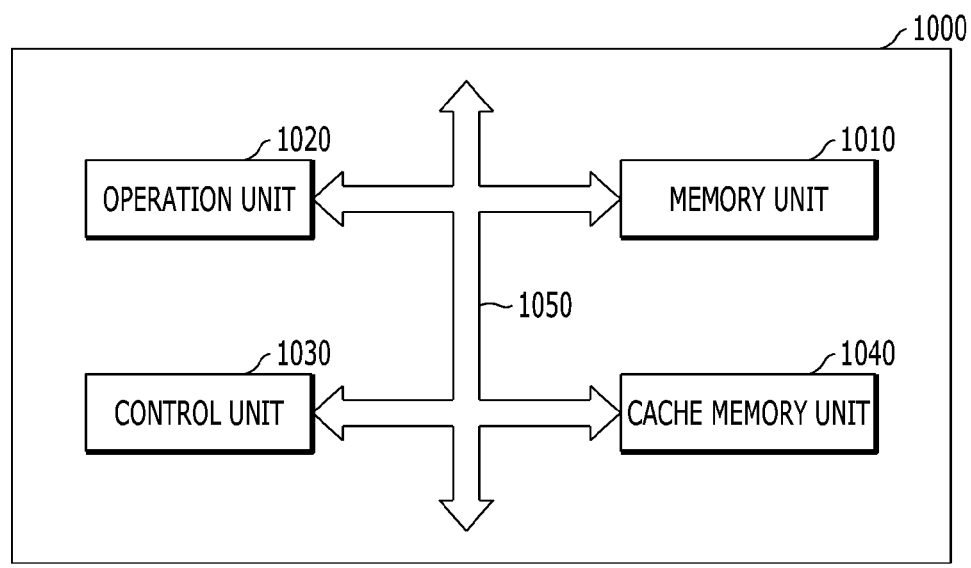
FIG. 4 is an example of configuration diagram of a microprocessor implementing memory circuitry based on the disclosed technology.

FIG. 4 is an example of configuration diagram of a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a buried gate; a recess disposed between the buried gate and a neighboring gate; a crystalized doped layer formed in the substrate under the recess; a landing plug formed in the recess and including a stack of a silicide layer and a metal layer; an interlayer insulating layer formed over the substrate including the landing plug; a lower electrode contact passing through the interlayer insulating layer and being in contact with the landing plug; and a variable resistance device formed over the interlayer insulating layer and being in contact with the lower electrode contact. Through this, a fabrication process of the memory unit 1010 may become easy and the reliability and yield of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
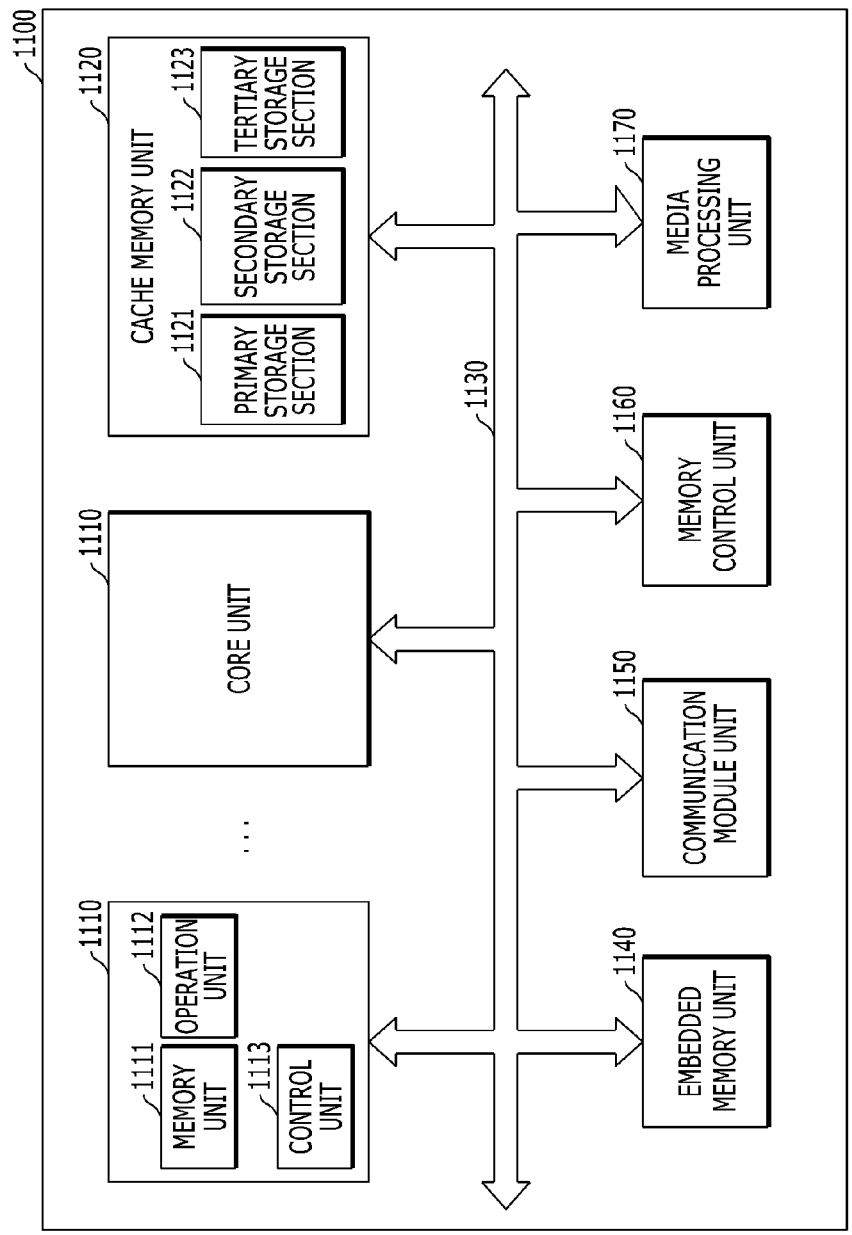
FIG. 5 is an example of configuration diagram of a processor implementing memory circuitry based on the disclosed technology.

FIG. 5 is an example of configuration diagram of a processor implementing memory circuitry based on the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a buried gate; a recess disposed between the buried gate and a neighboring gate; a crystalized doped layer formed in the substrate under the recess; a landing plug formed in the recess and including a stack of a silicide layer and a metal layer; an interlayer insulating layer formed over the substrate including the landing plug; a lower electrode contact passing through the interlayer insulating layer and being in contact with the landing plug; and a variable resistance device formed over the interlayer insulating layer and being in contact with the lower electrode contact. Through this, a fabrication process of the cache memory unit 1120 may become easy and the reliability and yield of the cache memory unit 1120 may be improved. As a consequence, operating characteristics of the processor 1100 may be improved.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
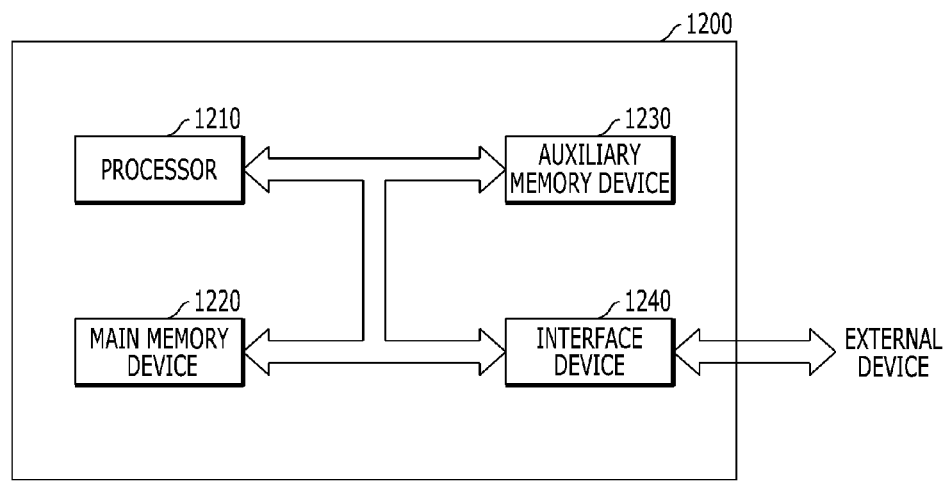
FIG. 6 is an example of configuration diagram of a system implementing memory circuitry based on the disclosed technology.

FIG. 6 is an example of configuration diagram of a system implementing memory circuitry based on the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a buried gate; a recess disposed between the buried gate and a neighboring gate; a crystalized doped layer formed in the substrate under the recess; a landing plug formed in the recess and including a stack of a silicide layer and a metal layer; an interlayer insulating layer formed over the substrate including the landing plug; a lower electrode contact passing through the interlayer insulating layer and being in contact with the landing plug; and a variable resistance device formed over the interlayer insulating layer and being in contact with the lower electrode contact. Through this, a fabrication process of the main memory device 1220 may become easy and the reliability and yield of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a buried gate; a recess disposed between the buried gate and a neighboring gate; a crystalized doped layer formed in the substrate under the recess; a landing plug formed in the recess and including a stack of a silicide layer and a metal layer; an interlayer insulating layer formed over the substrate including the landing plug; a lower electrode contact passing through the interlayer insulating layer and being in contact with the landing plug; and a variable resistance device formed over the interlayer insulating layer and being in contact with the lower electrode contact. Through this, a fabrication process of the auxiliary memory device 1230 may become easy and the reliability and yield of the auxiliary memory device 1230 may be improved. As a consequence, operating characteristics of the system 1200 may be improved.

Also, the auxiliary memory device 1230 may further include a data storage system (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
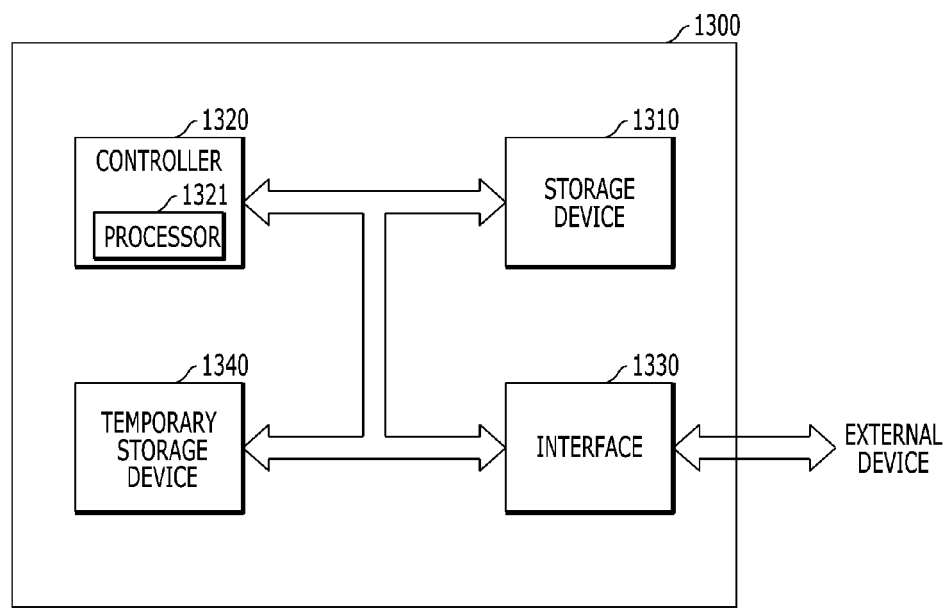
FIG. 7 is an example of configuration diagram of a data storage system implementing memory circuitry based on the disclosed technology.

FIG. 7 is an example of configuration diagram of a data storage system implementing memory circuitry based on the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a buried gate; a recess disposed between the buried gate and a neighboring gate; a crystalized doped layer formed in the substrate under the recess; a landing plug formed in the recess and including a stack of a silicide layer and a metal layer; an interlayer insulating layer formed over the substrate including the landing plug; a lower electrode contact passing through the interlayer insulating layer and being in contact with the landing plug; and a variable resistance device formed over the interlayer insulating layer and being in contact with the lower electrode contact. Through this, a fabrication process of the storage device 1310 or the temporary storage device 1340 may become easy and the reliability and yield of the storage device 1310 or the temporary storage device 1340 may be improved. As a consequence, operating characteristics and data storage characteristics of the data storage system 1300 may be improved.

Figure 8:
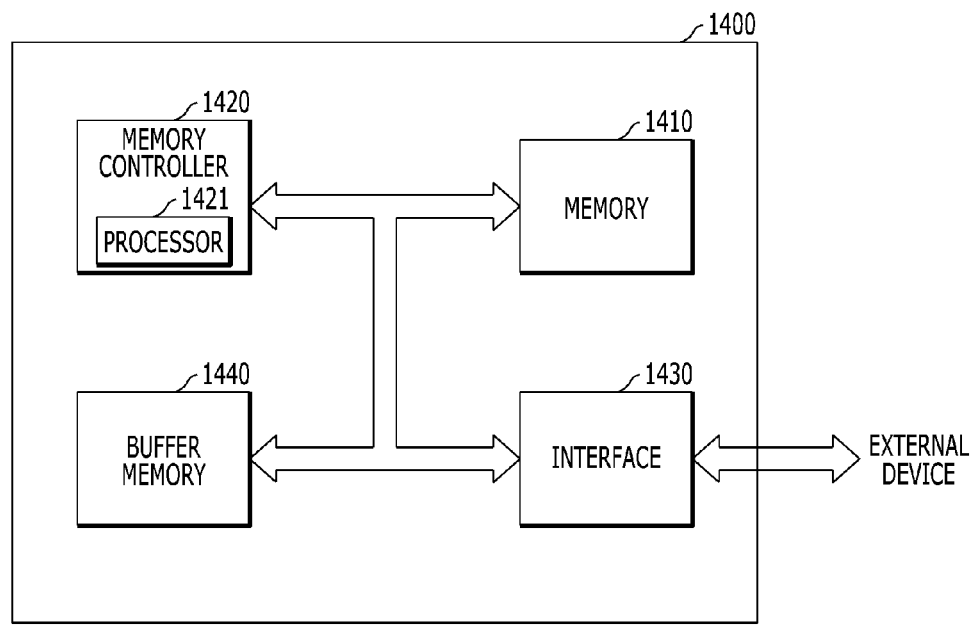
FIG. 8 is an example of configuration diagram of a memory system implementing memory circuitry based on the disclosed technology.

FIG. 8 is an example of configuration diagram of a memory system implementing memory circuitry based on the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a buried gate; a recess disposed between the buried gate and a neighboring gate; a crystalized doped layer formed in the substrate under the recess; a landing plug formed in the recess and including a stack of a silicide layer and a metal layer; an interlayer insulating layer formed over the substrate including the landing plug; a lower electrode contact passing through the interlayer insulating layer and being in contact with the landing plug; and a variable resistance device formed over the interlayer insulating layer and being in contact with the lower electrode contact. Through this, a fabrication process of the memory 1410 may become easy and the reliability and yield of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a buried gate; a recess disposed between the buried gate and a neighboring gate; a crystalized doped layer formed in the substrate under the recess; a landing plug formed in the recess and including a stack of a silicide layer and a metal layer; an interlayer insulating layer formed over the substrate including the landing plug; a lower electrode contact passing through the interlayer insulating layer and being in contact with the landing plug; and a variable resistance device formed over the interlayer insulating layer and being in contact with the lower electrode contact. Through this, a fabrication process of the buffer memory 1440 may become easy and the reliability and yield of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for forming an electronic device with a semiconductor memory, comprising:
   forming a crystalized doped layer over a substrate;
   forming a barrier layer over the crystalized doped layer;
   forming a metal layer over the barrier layer; and
   reacting the barrier layer with a portion of the metal layer.

2. The method of claim 1, wherein the forming of the crystalized doped layer includes:
   doping impurities into the substrate to form a doped region in the substrate; and
   performing laser annealing to recrystallize the doped region to form the crystalized doped layer.

3. The method of claim 2, wherein the barrier layer has a depth smaller than the depth of the doped region.

4. The method of claim 1, wherein the forming of the barrier layer includes transforming the material structure of a portion of the crystalized doped layer into an amorphous layer.

5. The method of claim 1, wherein the forming of the barrier layer includes performing ion implantation into the crystalized doped layer.

6. The method of claim 1, wherein the metal layer includes a single layer or a multi-layer.

7. The method of claim 1, wherein the metal layer includes a stack including a titanium layer and a titanium nitride layer.

8. The method of claim 1, wherein the reacting of the barrier layer and the portion of the metal layer includes performing heat treatment on the barrier layer and the portion of the metal layer.

9. The method of claim 1, wherein the reacting of the barrier layer with the portion of the metal layer including forming a silicide layer.

10. A method for forming an electronic device with a semiconductor memory, comprising:
   forming buried gates in a substrate;
   forming a recess in the substrate between neighboring buried gates;
   forming a crystalized doped layer to fill in a lower portion of the recess;
   forming a landing plug in the recess over the crystalized doped layer, wherein the landing plug includes a stack of a silicide layer and a metal layer;
   forming an interlayer insulating layer over the substrate including the landing plug;
   forming a lower electrode contact that passes through the interlayer insulating layer and is in contact with the landing plug; and forming a variable resistance element which is disposed over the interlayer insulating layer and is coupled to the lower electrode contact.

11. The method of claim 10, wherein the forming of the crystalized doped layer includes:
   doping impurities into the substrate under the recess to form a doped region; and
   performing laser annealing to recrystallize the doped region to form the crystalized doped layer.

12. The method of claim 10, wherein the forming of the landing plug includes:
   changing the material structure of the crystalized doped layer to form a barrier layer over the crystalized doped layer;
   forming the metal layer over the barrier layer to fill the recess; and
   reacting the barrier layer and a portion of the metal layer.

13. The method of claim 12, wherein the changing of the material structure of the crystalized doped layer includes transforming a portion of the crystalized doped layer into an amorphous layer.

14. The method of claim 12, wherein the changing of the material structure of the crystalized doped layer includes performing ion implantation into the crystalized doped layer.

15. The method of claim 12, wherein the reacting of the barrier layer and the portion of the metal layer includes performing heat treatment on the barrier layer and the portion of the metal layer.

16. The method of claim 10, wherein the metal layer includes a single layer or a multi-layer.

17. The method of claim 10, wherein the metal layer includes a stack including a titanium layer and a titanium nitride layer.

* * * * *